United States Patent
Fujita et al.

(10) Patent No.: US 10,333,507 B2
(45) Date of Patent: Jun. 25, 2019

(54) SERIALIZER DEVICE

(71) Applicant: THINE ELECTRONICS, INC., Tokyo (JP)

(72) Inventors: Yusuke Fujita, Tokyo (JP); Shunichi Kubo, Tokyo (JP); Yoshinobu Oshima, Tokyo (JP)

(73) Assignee: THINE ELECTRONICS, INC., Chiyoda-ku, Tokyo (JP)

( * ) Notice: Subject to any disclaimer, the term of this patent is extended or adjusted under 35 U.S.C. 154(b) by 0 days.

(21) Appl. No.: 15/546,509

(22) PCT Filed: Jan. 6, 2017

(86) PCT No.: PCT/JP2017/000287
§ 371 (c)(1),
(2) Date: Jul. 26, 2017

(87) PCT Pub. No.: WO2017/119488
PCT Pub. Date: Jul. 13, 2017

(65) Prior Publication Data
US 2018/0302076 A1    Oct. 18, 2018

(30) Foreign Application Priority Data
Jan. 8, 2016   (JP) ................. 2016-002722

(51) Int. Cl.
*H03M 9/00* (2006.01)
*H03K 5/26* (2006.01)
(Continued)

(52) U.S. Cl.
CPC ............. *H03K 5/26* (2013.01); *H03K 5/135* (2013.01); *H03M 9/00* (2013.01); *G11C 7/106* (2013.01)

(58) Field of Classification Search
CPC ................. H03K 5/135; H03K 5/26
(Continued)

(56) References Cited

U.S. PATENT DOCUMENTS

| 7,746,251 B2 | 6/2010 | Gonzalez |
| 7,973,691 B2 * | 7/2011 | Yamaguchi ........... H04L 7/0334 341/133 |
| 2004/0113823 A1 * | 6/2004 | Huang ................. H03M 9/00 341/100 |

FOREIGN PATENT DOCUMENTS

| JP | 06104741 A | 4/1994 |
| JP | 06244739 A | 9/1994 |

(Continued)

OTHER PUBLICATIONS

International Preliminary Report on Patentability with the translation of Written Opinion dated Jul. 19, 2018 issued by the International Bureau in International application No. PCT/JP2017/000287.

*Primary Examiner* — Peguy Jean Pierre
(74) *Attorney, Agent, or Firm* — Sughrue Mion, PLLC

(57) ABSTRACT

A serializer device (1) includes a first latch unit (11), a second latch unit (12), a conversion unit (13), a frequency division unit (14), a load signal generation unit (15), a phase difference detection unit (16), and a reset instruction unit (17), and has a simple configuration and can reduce a bit error rate at an early stage. The phase difference detection unit (16) detects a phase difference between a first clock (CLK1) applied to the first latch unit (11) and a third clock (CLK3) applied to the second latch unit (12). The reset instruction unit (17) outputs a reset instruction signal (RSTn) to the frequency division unit (14) when the phase difference is not within a target range.

6 Claims, 8 Drawing Sheets

(51) Int. Cl.
*H03K 5/135* (2006.01)
*G11C 7/10* (2006.01)

(58) Field of Classification Search
USPC .......................................................... 341/100
See application file for complete search history.

(56) References Cited

FOREIGN PATENT DOCUMENTS

| | | | |
|---|---|---|---|
| JP | 10107786 A | 4/1998 |
| JP | 2009118449 A | 5/2009 |
| WO | 2004040835 A1 | 5/2004 |

* cited by examiner

SERIALIZER DEVICE

TECHNICAL FIELD

The present invention relates to a serializer device.

BACKGROUND

A serializer device serializes parallel data input in synchronization with a first clock and outputs the serial data in synchronization with a second clock. The serializer device includes a latch unit and a conversion unit. The latch unit latches input parallel data at a timing instructed by the first clock. The conversion unit latches the parallel data that is latched and output by the latch unit at a timing instructed by a load signal and outputs the latched data as the serial data in synchronization with the second clock. A period of the second clock is shorter than a period of the first clock. The load signal applied to the conversion unit is generated based on the second clock with the same period as the first clock (refer to Patent Literature 1)

CITATION LIST

Patent Literature

[Patent Literature 1] U.S. Pat. No. 7,746,251

SUMMARY OF INVENTION

Technical Problem

In a serializer device, it is important for a phase difference between a first clock and a load signal to be set within an appropriate range according to margins of a setup-time and a hold-time when a conversion unit performs a latch operation so that parallel data output from the latch unit can be reliably latched by the conversion unit.

When the phase difference between the first clock and the load signal is outside an appropriate range due to a malfunction caused by noise or a change in temperature, an error occurs in serial data output from the serializer device. When a reception device configured to receive serial data output from a serializer device detects that a bit error rate of the received data is large, the reception device notifies the serializer device on a transmission side of the fact. Then, in the serializer device that has received the notification, a load signal generation operation is reset so that the phase difference between the first clock and the load signal is restored to be within an appropriate range.

However, a system configuration in which the reception device notifies the serializer device on the transmission side of the fact that a bit error rate is large assumes that bidirectional communication is provided and communication from a reception side to the serializer device on the transmission side is fast.

When there is no communication line from the reception side to the transmission side, it is not possible for the reception device to notify the serializer device on the transmission side of the fact that a bit error rate is large, and it is not possible for the serializer device to restore the phase difference between the first clock and the load signal to be within an appropriate range.

When there is a communication line from the reception side to the transmission side, but the communication line is simple and slow, it takes a long time for the reception device to notify the serializer device on the transmission side of the fact that a bit error rate is large, and it takes a long time for the serializer device to restore the phase difference between the first clock and the load signal to be within an appropriate range. Therefore, a state in which a bit error rate is large continues for a long time.

The present invention has been made in view of the above problems and an object of the present invention is to provide a serializer device having a simple configuration and capable of reducing a bit error rate at an early stage.

Solution to Problem

A serializer device is configured to serialize parallel data input in synchronization with a first clock and output the serial data in synchronization with a second clock, the serializer device including: (1) a first latch unit configured to latch the input parallel data at a timing instructed by the first clock, (2) a second latch unit configured to latch parallel data that is latched and output by the first latch unit at a timing instructed by a third clock with the same period as the first clock, (3) a conversion unit configured to latch parallel data that is latched and output by the second latch unit at a timing instructed by a load signal with the same period as the first clock and output the latched data as serial data in synchronization with the second clock, (4) a frequency division unit configured to frequency-divide the second clock and generate a third clock, (5) a load signal generation unit configured to generate the load signal based on the third clock, (6) a phase difference detection unit configured to detect a phase difference between either of the third clock and the load signal, and the first clock, and (7) a reset instruction unit configured to reset a frequency division operation in the frequency division unit when the phase difference detected by the phase difference detection unit is not within a target range.

In the serializer device, the phase difference detection unit preferably includes (1) a shift register that uses one of the first clock and the third clock as input data and shifts the input data using a clock with a shorter period than the first clock; (2) a shift register output latch unit configured to latch data output from the shift register using the other of the first clock and the third clock or a timing instructed by the load signal; and (3) a detection unit configured to detect the phase difference based on data latched by the shift register output latch unit.

In addition, in the serializer device, the phase difference detection unit preferably includes (1) a flip-flop that uses one of the first clock and the third clock as input data and uses the other of the first clock and the third clock or a load signal as an input clock; and (2) a detection unit configured to detect the phase difference based on data output from the flip-flop.

According to another aspect, there is a serializer device configured to serialize parallel data input in synchronization with a first clock and output the serial data in synchronization with a second clock, the serializer device including: (1) a latch unit configured to latch the input parallel data at a timing instructed by the first clock; (2) a conversion unit configured to latch parallel data that is latched and output by the latch unit at a timing instructed by a load signal with the same period as the first clock and output the latched data as the serial data in synchronization with the second clock; (3) a load signal generation unit configured to generate the load signal based on the second clock; (4) a phase difference detection unit configured to detect a phase difference between the load signal and the first clock; and (5) a reset instruction unit configured to reset a load signal generation operation in the load signal generation unit when the phase difference detected by the phase difference detection unit is not within a target range.

The above serializer device includes a flip-flop group that includes a plurality of flip-flops arranged in parallel; a parallel to serial converter that is provided at a stage subsequent to the flip-flop group and connected to a load signal output terminal; a load signal generator including the load signal output terminal; a frequency divider that includes an output terminal connected to an input terminal of the load signal generator and a reset terminal; a reset signal generator that is connected to the reset terminal of the frequency divider; and a phase comparator that is connected to an input of the reset signal generator, wherein the output terminal of the frequency divider is connected to an input terminal of the phase comparator.

Here, when the first latch unit and the second latch unit are included, the flip-flop group in this case includes a first flip-flop group that includes a plurality of flip-flops arranged in parallel, and a second flip-flop group that is arranged at a stage subsequent to the first flip-flop group and includes a plurality of flip-flops arranged in parallel.

Advantageous Effects of Invention

The serializer device of the present invention has a simple configuration and can reduce a bit error rate at an early stage.

DESCRIPTION OF EMBODIMENTS

Figure 1:
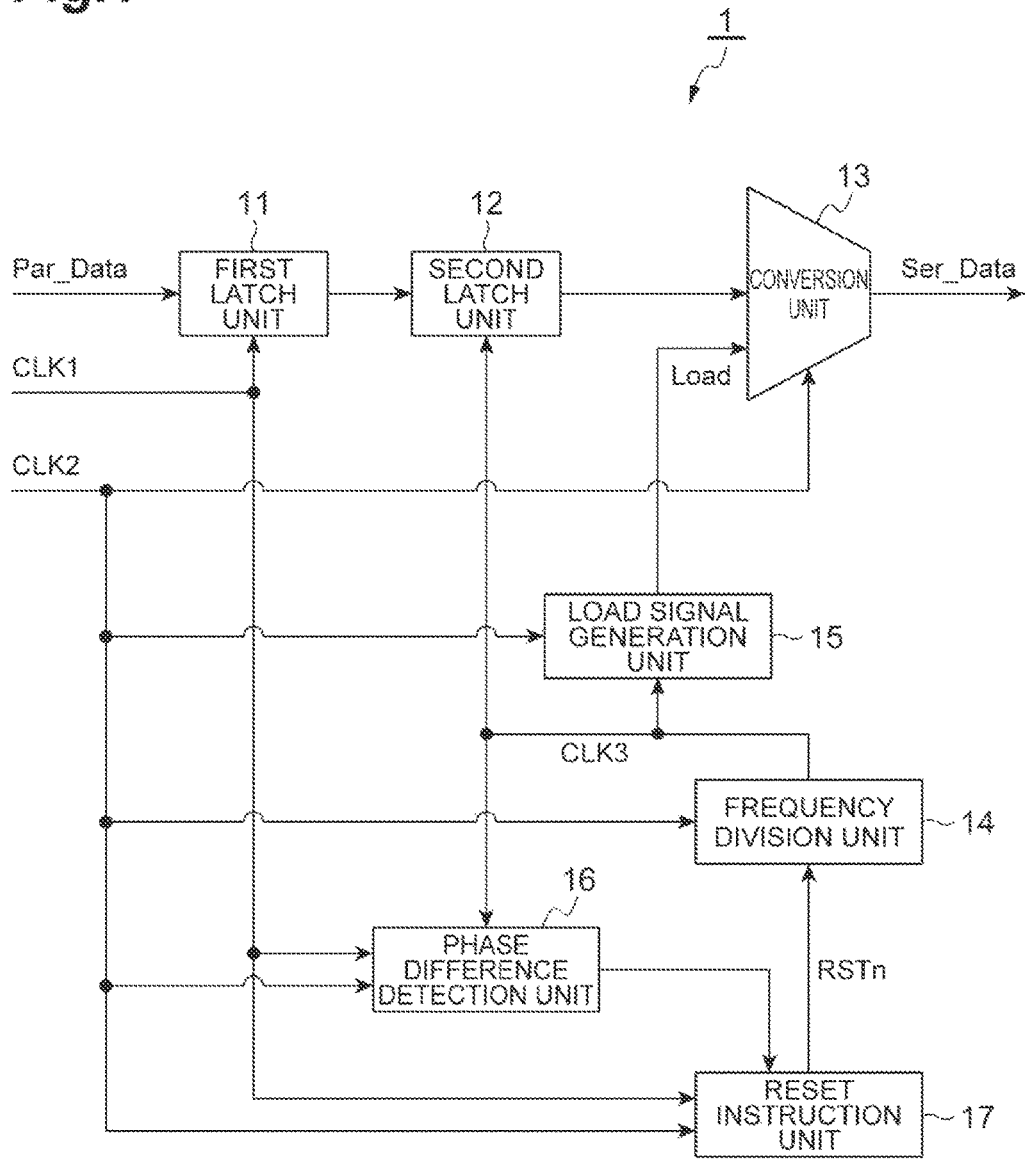
FIG. 1 is a diagram showing a configuration of a serializer device 1 of a first embodiment.

Forms for implementing the present invention will be described below in detail with reference to the appended drawings. Here, the same components in descriptions of the drawings are denoted with the same reference numerals, and redundant descriptions will be omitted. The present invention is not limited to such examples, and includes the scope described in the claims, equivalents to the scope of the claims, and all modifications within the scope.

First Embodiment

FIG. 1 is a diagram showing a configuration of a serializer device 1 of a first embodiment. The serializer device 1 serializes parallel data Par_Data input in synchronization with a first clock CLK1 and outputs the serial data Ser_Data in synchronization with a second clock CLK2. A period of the second clock CLK2 is shorter than a period of the first clock CLK1. The serializer device 1 includes a first latch unit 11, a second latch unit 12, a conversion unit 13, a frequency division unit 14, a load signal generation unit 15, a phase difference detection unit 16, and a reset instruction unit 17.

The first latch unit 11 latches and outputs the input parallel data Par_Data at a timing instructed by the first clock CLK1. The second latch unit 12 latches and outputs parallel data that is latched and output by the first latch unit 11 at a timing instructed by a third clock CLK3. The third clock CLK3 has the same period as the first clock CLK1. For example, the first latch unit 11 and the second latch unit 12 may each have a configuration in which a number of flip-flops corresponding to or greater than the number of bits of the parallel data Par_Data are arranged in parallel.

The conversion unit 13 converts parallel data into serial data. The conversion unit 13 latches parallel data that is latched and output by the second latch unit 12 at a timing instructed by a load signal Load and outputs the latched data as the serial data Ser_Data in synchronization with the second clock CLK2. The load signal Load has the same period as the first clock CLK1. The conversion unit 13 has, for example, a configuration including a shift register in which a plurality of flip-flops are connected in series, latches parallel data in each of the flip-flops of the shift register according to an instruction of the load signal Load, shifts the shift register according to an instruction of the second clock CLK2, and can output the serial data Ser_Data.

The frequency division unit 14 frequency-divides the second clock CLK2 and generates a third clock CLK3. In addition, the frequency division unit 14 can reset a frequency division operation according to an instruction of a reset instruction signal RSTn. The frequency division unit 14 has, for example, a configuration that includes a counter, and can perform a counter operation according to an instruction of the second clock CLK2 and reset a counter operation according to an instruction of the reset instruction signal RSTn. The third clock CLK3 generated by the frequency division unit 14 is applied to the second latch unit 12, the load signal generation unit 15, and the phase difference detection unit 16.

The load signal generation unit 15 generates a load signal Load based on the third clock CLK3. The load signal generation unit 15 has, for example, a configuration including a shift register in which a plurality of flip-flops are connected in series, uses the third clock CLK3 as input data of the first stage flip-flop of the shift register, shifts the shift register according to an instruction of the second clock CLK2 (or another clock with a shorter period than the first clock CLK1), and can use a signal output from the last stage flip-flop of the shift register as the load signal Load. The load signal Load output from the load signal generation unit 15 is applied to the conversion unit 13.

The phase difference detection unit 16 detects a phase difference between the third clock CLK3 and the first clock CLK1. Alternatively, the phase difference detection unit 16 may detect a phase difference between the load signal Load and the first clock CLK1. When the phase difference detected by the phase difference detection unit 16 is not within a target range, the reset instruction unit 17 outputs the reset instruction signal RSTn for resetting a frequency division operation in the frequency division unit 14 to the frequency division unit 14.

Figure 2:
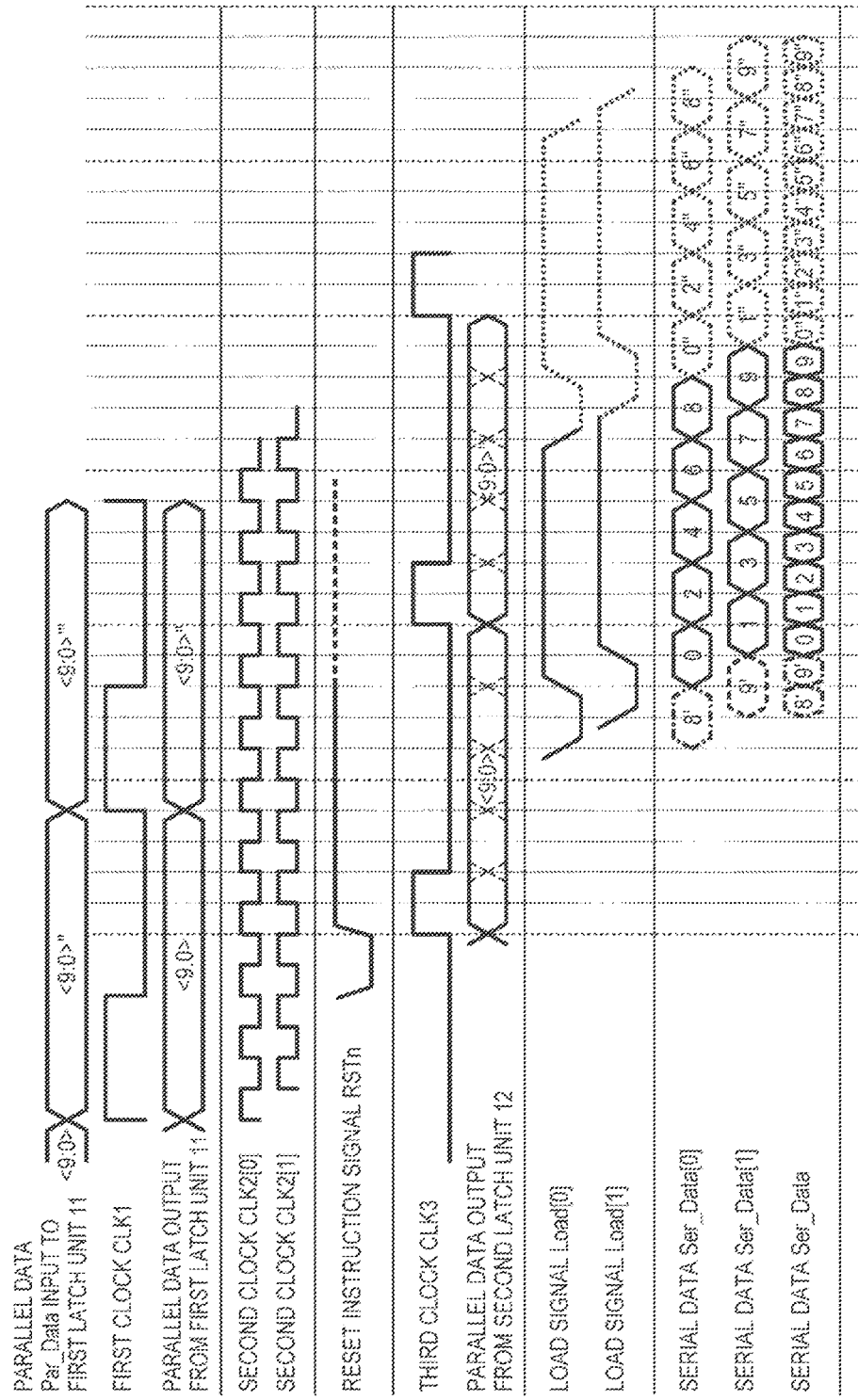
FIG. 2 is a timing chart explaining operation of the serializer device 1 of the first embodiment.

FIG. 2 is a timing chart explaining operation of the serializer device 1 of the first embodiment. In FIG. 2, in order from the top, the parallel data Par_Data input to the first latch unit 11, the first clock CLK1, parallel data output from the first latch unit 11, the second clocks CLK2[0] and CLK2[1], the reset instruction signal RSTn output from the reset instruction unit 17, the third clock CLK3, the parallel data output from the second latch unit 12, the load signals Load[0] and Load[1], and the serial data Ser_Data[0], Ser_Data[1], and Ser_Data are shown.

In FIG. 2, the parallel data Par_Data is 10-bit data. In addition, the second clock CLK2 is set as two-phase clocks CLK2[0] and CLK2[1]. The load signal Load[0] and the serial data Ser_Data[0] are generated based on the second clock CLK2[0] of one phase, and the load signal Load[1] and the serial data Ser_Data[1] are generated based on the second clock CLK2[1] of the other phase.

The parallel data Par_Data, the first clock CLK1, and the second clock CLK2 are input to the serializer device 1. As shown in FIG. 2, the first clock CLK1 is synchronized with the parallel data Par_Data. The second clock CLK2 is synchronized with the serial data Ser_Data. A period of the second clock CLK2 is shorter than a period of the first clock CLK1. The third clock CLK3 and the load signal Load have the same period as the first clock CLK1.

A phase difference between the first clock CLK1 and the third clock CLK3 is set within an appropriate range according to margins of a setup-time and a hold-time when the second latch unit 12 performs a latch operation. A phase difference between the third clock CLK3 and the load signal Load is set within an appropriate range according to margins of a setup-time and a hold-time when the conversion unit 13 performs a latch operation.

In the first latch unit 11, the input parallel data Par_Data is latched at a timing of the rising edge of the first clock CLK1, and the latched parallel data is output to the second latch unit 12. In the second latch unit 12, the parallel data output from the first latch unit 11 is latched at a timing of the rising edge of the third clock CLK3 and the latched parallel data is output to the conversion unit 13.

In the conversion unit 13, the parallel data output from the second latch unit 12 is latched at a timing of the rising edge of the load signal Load, and the latched data is output as the serial data Ser_Data in synchronization with the second clock CLK2.

In the frequency division unit 14, the second clock CLK2 is frequency-divided, and the third clock CLK3 is generated. In addition, in the frequency division unit 14, a frequency division operation is reset according to an instruction of the reset instruction signal RSTn. That is, when there is a rising edge of the reset instruction signal RSTn, the phase of the third clock CLK3 is adjusted so that the rising edge of the third clock CLK3 is generated at this timing.

In the load signal generation unit 15, a load signal Load is generated based on the third clock CLK3. When the period of the second clock CLK2 is set as T, in the load signal Load[0], a falling edge occurs at a timing after the time 3T from a timing of the rising edge of the third clock CLK3, and a rising edge occurs at a timing after the time 4T. In the load signal Load[1], a falling edge occurs at a timing after the time 3.5T from a timing of the rising edge of the third clock CLK3, and a rising edge occurs at a timing after the time 4.5T.

In the phase difference detection unit 16, a phase difference between the third clock CLK3 and the first clock CLK1 is detected. Alternatively, a phase difference between the load signal Load and the first clock CLK1 is detected. Thus, in the reset instruction unit 17, when the phase difference detected by the phase difference detection unit 16 is not within a target range, a reset instruction signal RSTn in which a rising edge occurs at a timing after the time 3T from a timing of the rising edge of the first clock CLK1 is generated, and the reset instruction signal RSTn is output to the frequency division unit 14.

Figure 3:
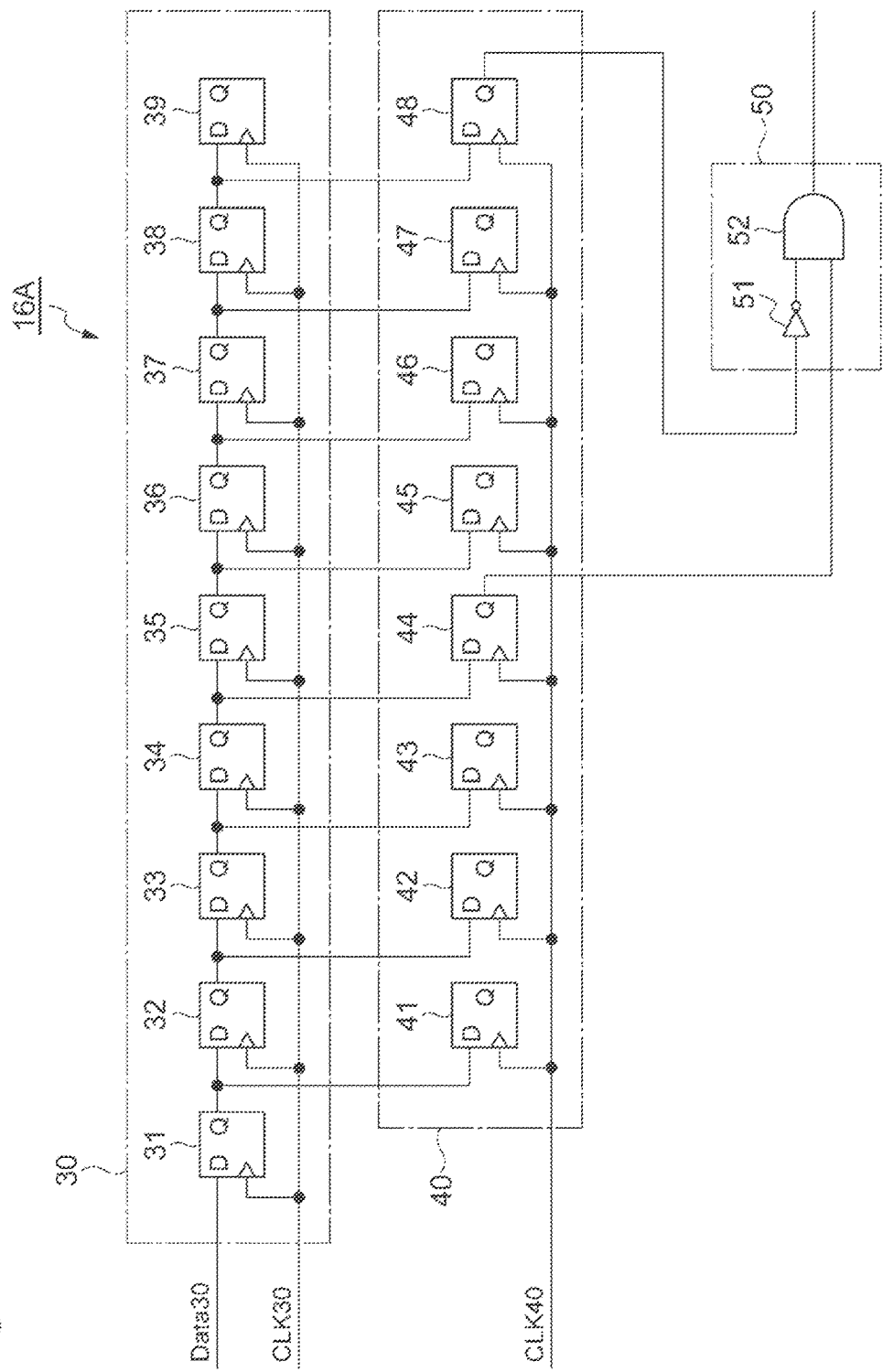
FIG. 3 is a diagram showing a first configuration example of a phase difference detection unit 16.

FIG. 3 is a diagram showing a first configuration example of the phase difference detection unit 16. A phase difference detection unit 16A of the first configuration example includes a shift register 30, a shift register output latch unit 40, and a detection unit 50. The shift register 30 has a configuration in which flip-flops 31 to 39 are connected in series. The shift register output latch unit 40 has a configuration in which flip-flops 41 to 48 are arranged in parallel. The detection unit 50 includes a logic inversion circuit 51 and an AND circuit 52.

Output data of the flip-flop 31 serves as input data of the next stage flip-flop 32 and serves as input data of the flip-flop 41. Output data of the flip-flop 32 serves as input data of the next stage flip-flop 33 and serves as input data of the flip-flop 42. Output data of the flip-flop 33 serves as input data of the next stage flip-flop 34 and serves as input data of the flip-flop 43. Output data of the flip-flop 34 serves as input data of the next stage flip-flop 35 and serves as input data of the flip-flop 44.

Output data of the flip-flop 35 serves as input data of the next stage flip-flop 36 and serves as input data of the flip-flop 45. Output data of the flip-flop 36 serves as input data of the next stage flip-flop 37 and serves as input data of the flip-flop 46. Output data of the flip-flop 37 serves as input data of the next stage flip-flop 38 and serves as input data of the flip-flop 47. Output data of the flip-flop 38 serves as input data of the last stage flip-flop 39 and serves as input data of the flip-flop 48. The last stage flip-flop 39 is provided as a dummy.

The AND circuit 52 receives data that is obtained by the logic inversion circuit 51 logically inverting output data of the flip-flop 48, receives output data of the flip-flop 44, and outputs data representing a logical product of the two input data items.

As an input clock CLK30 that is commonly applied to the flip-flops 31 to 39 of the shift register 30, a clock with a shorter period than the first clock CLK1 is used, and the second clock CLK2 is preferably used.

As input data Data30 of the first stage flip-flop 31 of the shift register 30, the first clock CLK1 is used. As the input clock CLK40 that is commonly applied to the flip-flops 41 to 48 of the shift register output latch unit 40, the third clock CLK3 or the load signal Load is used. Alternatively, the third clock CLK3 is used as input data Data30, and the first clock CLK1 or the load signal Load is used as an input clock CLK40.

In the phase difference detection unit 16A having such a configuration, data output from the AND circuit 52 of the detection unit 50 indicates whether a phase difference between the rising edge of input data Data30 and the rising edge of the input clock CLK40 with a resolution of the period of the input clock CLK30 is within an appropriate range.

Here, a selection unit is provided between the shift register output latch unit 40 and the detection unit 50. When the selection unit can select two output data items input to the detection unit 50 from among output data items of the flip-flops 41 to 48 of the shift register output latch unit 40, it is possible to change an appropriate range of the phase difference.

Figure 4:
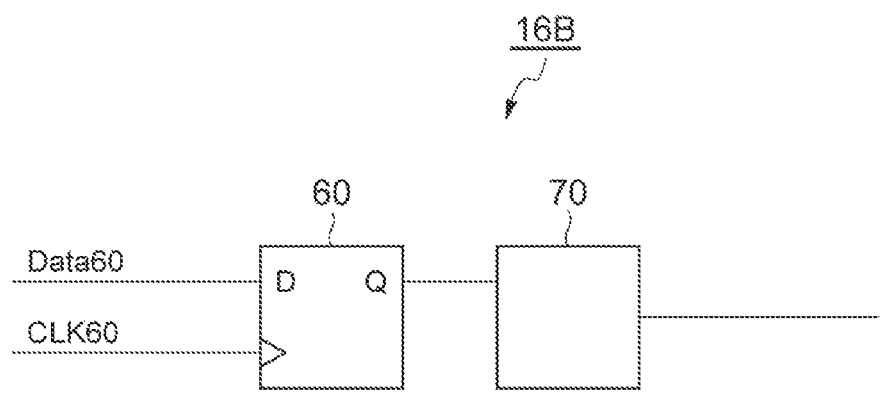
FIG. 4 is a diagram showing a second configuration example of the phase difference detection unit 16.

FIG. 4 is a diagram showing a second configuration example of the phase difference detection unit 16. A phase difference detection unit 16B of the second configuration example includes a flip-flop 60 and a detection unit 70. The first clock CLK1 is used as input data Data60 of the flip-flop 60. The third clock CLK3 or the load signal Load is used as an input clock CLK60 of the flip-flop 60. Alternatively, the third clock CLK3 is used as input data Data60, and the first clock CLK1 or the load signal Load is used as the input clock CLK60.

The detection unit 70 detects whether a phase difference between the input data Data60 and the input clock CLK60 is within an appropriate range based on data output from the flip-flop 60. That is, when margins of a setup-time and a hold-time when a latch operation is performed by a flip-flop are sufficient, since data output from the flip-flop is stable, the detection unit 70 determines whether data output from the flip-flop 60 is stable. Therefore, it is possible to detect whether a phase difference is within an appropriate range.

Here, the serializer device 1 includes both the phase difference detection unit 16A of the first configuration example and the phase difference detection unit 16B of the second configuration example and may use both separately. For example, when a frequency division ratio in the frequency division unit 14 is variable according to the number of bits of the parallel data Par_Data (that is, when a period of the third clock CLK3 is variable), if the period of the third clock CLK3 is short, the shift register 30 may not be able to perform a shift operation for a plurality of cycles in some cases in the phase difference detection unit 16A of the first configuration example. Therefore, the phase difference detection unit 16B of the second configuration example is preferably used.

When a bit error rate of serial data output from the conversion unit 13 becomes greater, the serializer device 1 of the present embodiment can detect that fact immediately based on a phase difference detection result obtained by the phase difference detection unit 16. When there is no signal line from a reception side to the serializer device 1 on a transmission side or when there is a communication line from the reception side to the transmission side but the communication line is simple and slow, it is possible to reduce the bit error rate at an early stage when the serializer device 1 on the transmission side itself detects a phase difference.

In addition, the serializer device 1 of the present embodiment includes the second latch unit 12 in addition to the first latch unit 11, thereby exhibiting the following effects. In general, when a transmission device including the serializer device 1 is formed on a semiconductor substrate, the layout of the serializer device 1 is custom-designed, but the layout of a circuit at the stage preceding the first latch unit 11 is automatically arranged and wired by a CAD system. Thus, a delay of the parallel data Par_Data input to the first latch unit 11 tends to be large and setup becomes difficult. In addition, when the variation in a delay between bits of the parallel data Par_Data tends to be large, and a setup-time varies while setup is difficult, a delay in output data from the first latch unit 11 greatly varies. As a result, a timing between output data of the first latch unit 11 and the load signal Load becomes strict. When the second latch unit 12 is provided at a stage subsequent to the first latch unit 11, a timing restriction of output data of the first latch unit 11 is only the rising edge of the third clock CLK3 and the timing restriction may be alleviated.

Second Embodiment

Figure 5:
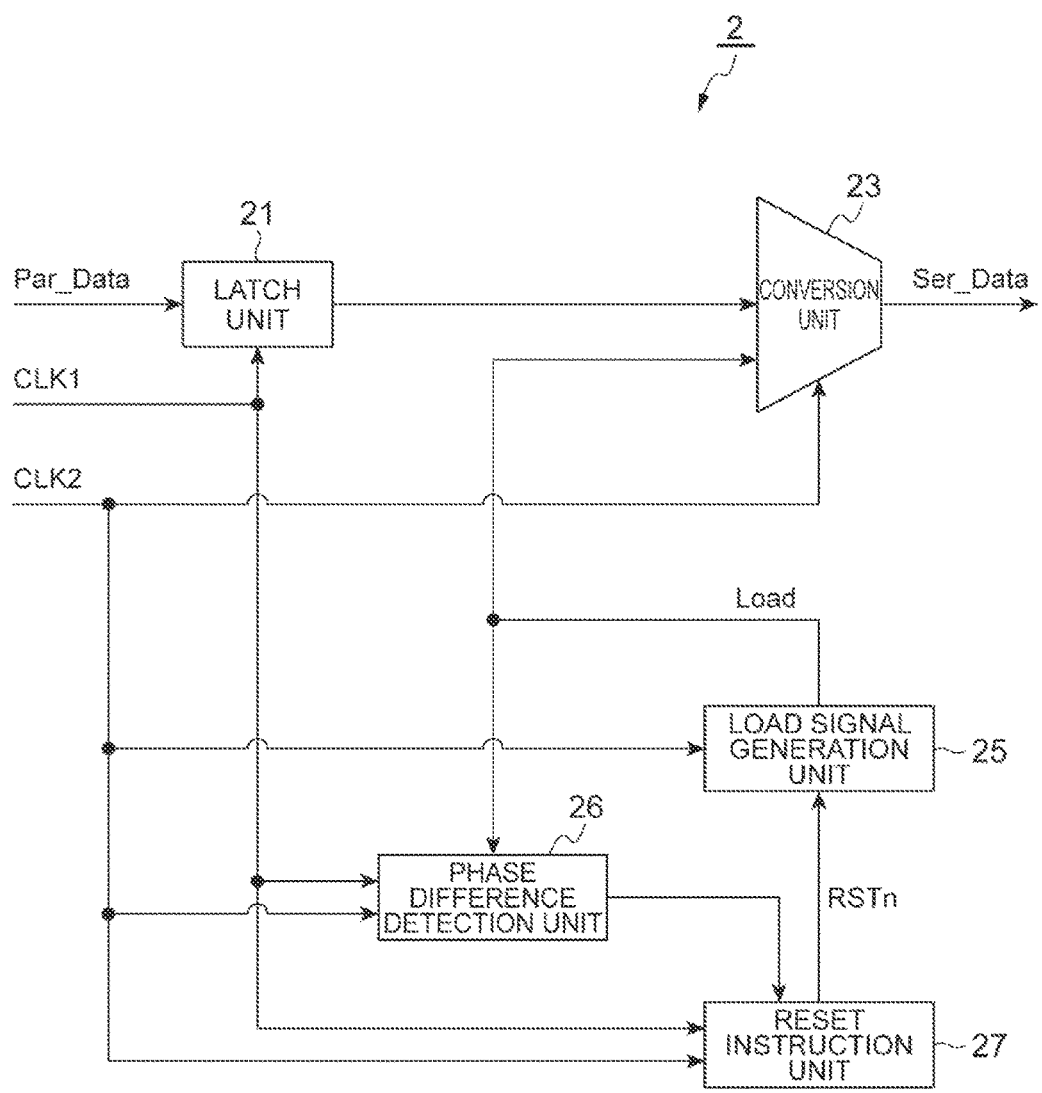
FIG. 5 is a diagram showing a configuration of a serializer device 2 of a second embodiment.

FIG. 5 is a diagram showing a configuration of a serializer device 2 of a second embodiment. The serializer device 2 serializes parallel data Par_Data input in synchronization with a first clock CLK1 and outputs the serial data Ser_Data in synchronization with a second clock CLK2. A period of the second clock CLK2 is shorter than a period of the first clock CLK1. The serializer device 2 includes a latch unit 21, a conversion unit 23, a load signal generation unit 25, a phase difference detection unit 26, and a reset instruction unit 27.

The latch unit 21 latches the input parallel data Par_Data at a timing instructed by the first clock CLK1. The latch unit 21 may have, for example, a configuration in which a number of flip-flops corresponding to or greater than the number of bits of the parallel data Par_Data are arranged in parallel.

The conversion unit 23 converts parallel data into serial data. The conversion unit 23 latches the parallel data that is latched and output by the latch unit 21 at a timing instructed by a load signal Load and outputs the latched data as the serial data Ser_Data in synchronization with the second clock CLK2. The load signal Load has the same period as the first clock CLK1. The conversion unit 23 has, for example, a configuration including a shift register in which a plurality of flip-flops are connected in series, latches parallel data in each of the flip-flops of the shift register according to an instruction of the load signal Load, shifts the shift register according to an instruction of the second clock CLK2, and can output the serial data Ser_Data.

The load signal generation unit 25 generates a load signal Load based on the second clock CLK2. In addition, the load signal generation unit 25 can reset a load signal generation operation according to an instruction of the reset instruction signal RSTn. The load signal generation unit 25 has, for example, a configuration that includes a counter and a shift register, performs a counter operation according to an instruction of the second clock CLK2, generates a frequency division clock, and can reset a counter operation according to an instruction of the reset instruction signal RSTn. In addition, the load signal generation unit 25 uses the frequency division clock as input data of the first stage flip-flop of the shift register, shifts the shift register according to an instruction of the second clock CLK2 (or another clock with a shorter period than the first clock CLK1), and can use a signal output from the last stage flip-flop of the shift register as the load signal Load. The load signal Load output from the load signal generation unit 25 is applied to the conversion unit 23.

The phase difference detection unit 26 detects a phase difference between the load signal Load and the first clock CLK1. The phase difference detection unit 26 may have the same configuration as the phase difference detection unit 16 in the first embodiment. When the phase difference detected by the phase difference detection unit 26 is not within a target range, the reset instruction unit 27 outputs the reset instruction signal RSTn for resetting a load signal generation operation in the load signal generation unit 25 to the load signal generation unit 25.

When a bit error rate of serial data output from the conversion unit 23 becomes greater, the serializer device 2 of the present embodiment can detect that fact immediately based on a phase difference detection result obtained by the phase difference detection unit 26. When there is no signal line from the reception side to the serializer device 2 on the transmission side, or when there is a communication line from the reception side to the transmission side but the communication line is simple and slow, it is possible to reduce the bit error rate at an early stage when the serializer device 2 on the transmission side itself detects a phase difference.

Here, supplementary description for the above circuit will be given.

Figure 6:
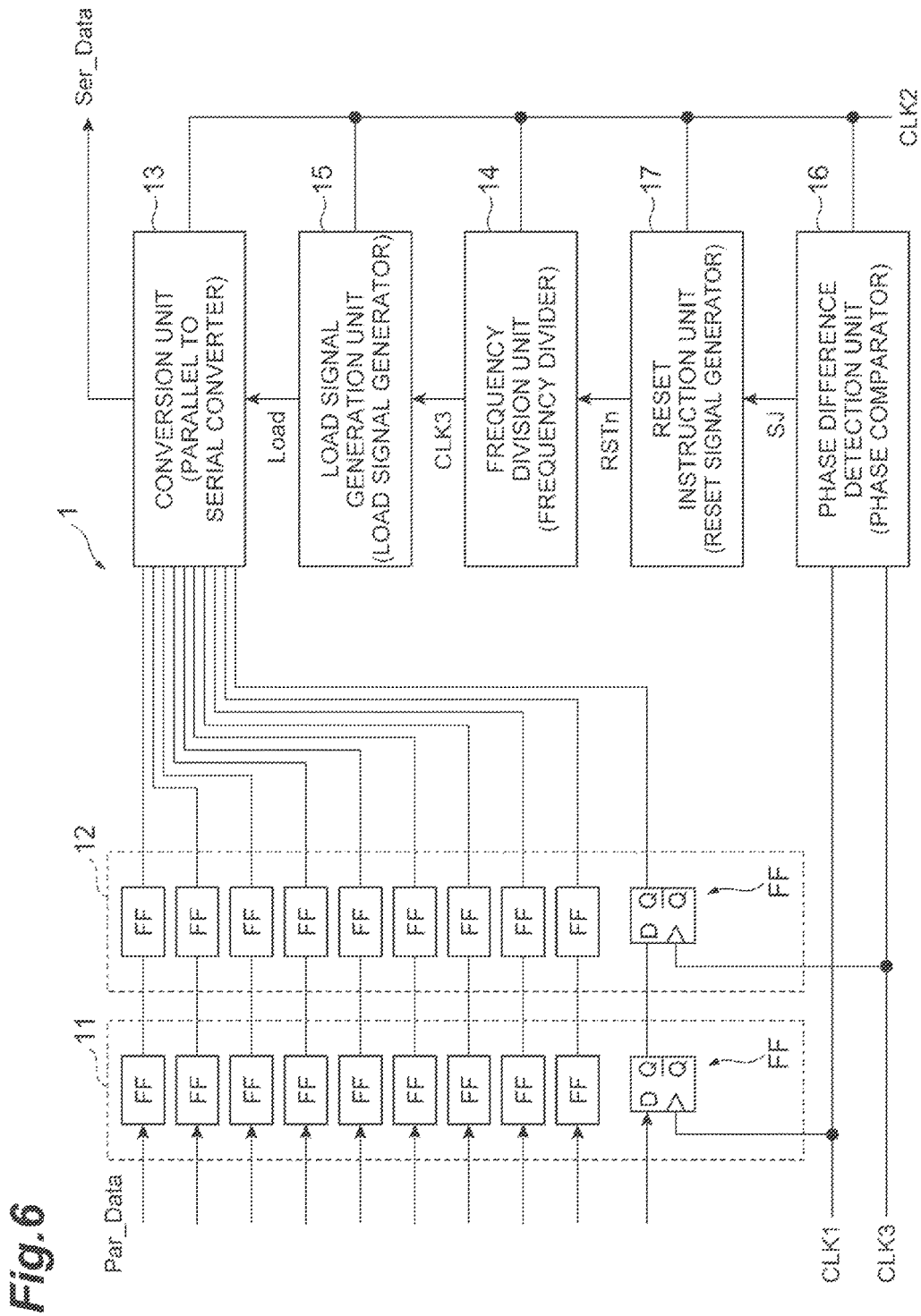
FIG. 6 is a diagram showing a configuration of the serializer device 1 shown in FIG. 1.

FIG. 6 is a diagram showing a configuration of the serializer device 1 shown in FIG. 1.

As described above, the first latch unit 11 includes a plurality of flip-flops FFs that are arranged in parallel. Similarly, the second latch unit 12 also includes a plurality of flip-flops FFs that are arranged in parallel. Each of the flip-flops FFs includes two input terminals and at least one output terminal.

Since all of the flip-flops FFs have the same structure, only the structure of one flip-flop FF in each latch unit is shown in detail for simplicity in FIG. 6. The flip-flop FF is a D flip-flop, and includes an input terminal D to which a signal is input and a clock input terminal (indicated by a triangle mark of a flip-flop FF) to which a clock is input. From an output terminal Q, a signal input to the input terminal D is output at a rising timing of the clock. Here, since an inverted signal of the output terminal Q can be output from the output terminal Q (with bar) of the flip-flop FF, the signal can be used to increase noise tolerance, for example, during signal transmission, as necessary for circuit design.

In FIG. 6, the first latch unit 11 includes, for example, 10 flip-flops FFs. The second latch unit 12 also includes, for example, 10 flip-flops FFs. Of course, the number of flip-flops can be changed according to a design. The parallel data output from the second latch unit 12 is input to the conversion unit 13 (parallel to serial converter: parallel-in serial-out (PISO)). The parallel to serial converter is a circuit that converts an input parallel signal into a serial signal, and various types of structure are known.

The phase difference detection unit 16 is a phase comparator and detects whether the phase of the third clock CLK3 is at a reference position. In this example, in order to detect the position of the third clock CLK3, the first clock CLK1 is used as a reference signal. In this example, it is detected whether a rising timing of the pulse of the third clock CLK3 is present near the center position of the period of the pulse of the first clock CLK1. Various structures of the phase comparator are known. For example, the phase comparator can output a pulse signal SJ proportional to the amount of phase shift at the rising time of the third clock CLK3 from a reference position (time) on the timing chart.

The reset instruction unit 17 is a reset signal generator, and generates a reset instruction signal RSTn (reset signal) for resetting the value of the subsequent stage frequency divider, for example, when the width of the pulse signal SJ exceeds a predetermined value, that is, when a rising position (time) of the third clock CLK3 on the timing chart is shifted more than the reference position (time).

The frequency division unit 14 (frequency divider) is a counter and decreases a repetition frequency of an input signal and outputs it. Many frequency dividers having a reset function are known.

The load signal generation unit 15 (load signal generator) receives the third clock CLK3 and shapes the waveform of the signal and outputs it. Specifically, when an input signal is inverted and a slight delay is caused in the signal, slopes of the rising edge and the falling edge of the signal become gentler.

The conversion unit 13 arranged at a stage subsequent to the load signal generation unit 15 is a parallel to serial converter. When a load signal (Load) of a predetermined level (low level) is input, digital data items D1, D2, D3 . . . D10 of the parallel data Par_Data are written in a register including a plurality of flip-flops FFs. When a load signal (Load) with a level (high level) opposite to the predetermined level is input, the register performs a clock operation, and these data items are transferred and output as serial data Ser_Data.

Each of the above phase comparator, reset signal generator, frequency divider, load signal generator, and parallel to serial converter can be configured using a plurality of logic circuits, or can be configured using a memory in which a program similar to this logic is included and a CPU for executing the program read from the memory.

The structure of the logic circuit will be described below supplementarily. The line on the input side of the logic circuit indicates an input terminal, and the line on the output side indicates an output terminal. Unless otherwise specified, the output terminal of each of the logic circuits is connected to an input terminal of the logic circuit at a stage subsequent thereto.

Figure 7:
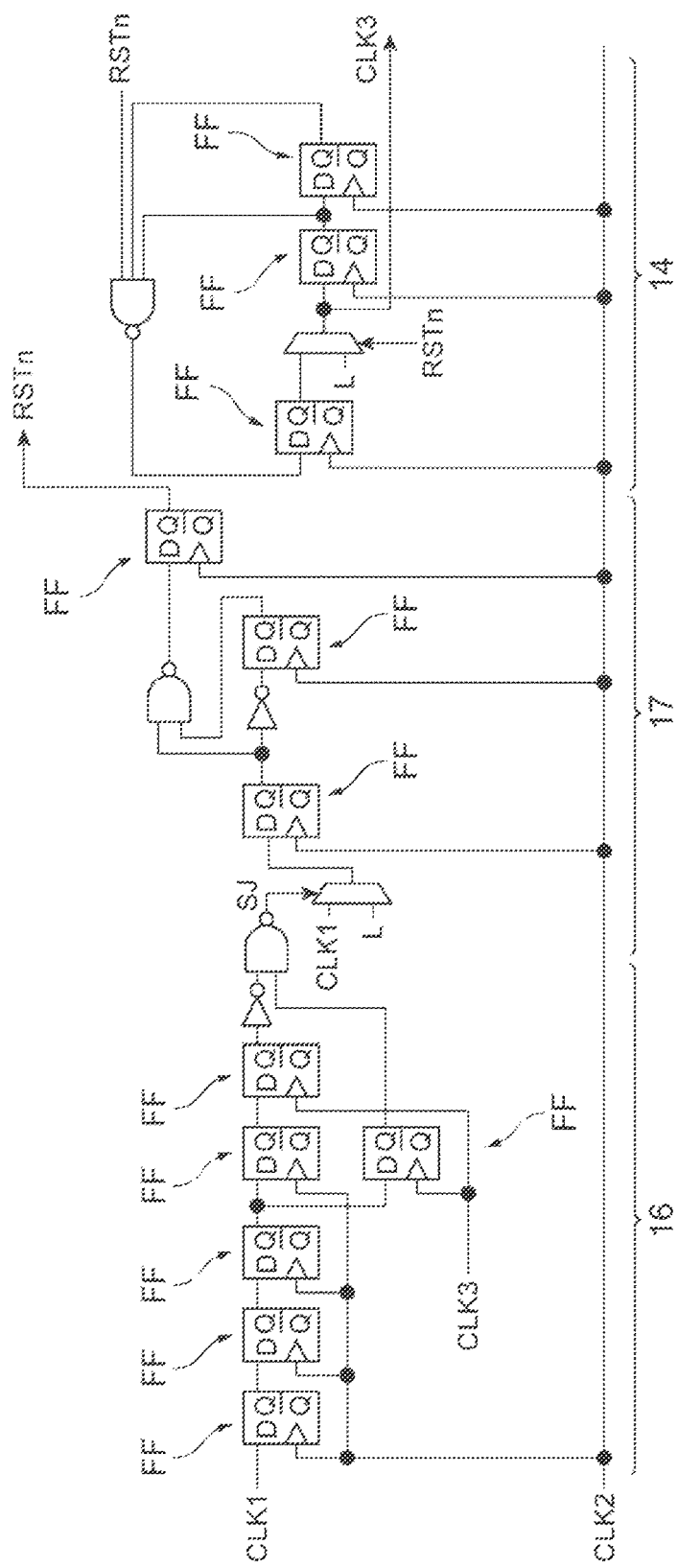
FIG. 7 is a circuit diagram showing an example of a logic circuit group (a phase difference detection unit 16, a reset instruction unit 17, and a frequency division unit 14).

FIG. 7 is a circuit diagram showing an example of a logic circuit group for performing the above logic operation (the phase difference detection unit 16, the reset instruction unit 17, and the frequency division unit 14). Since various circuit configurations for implementing the above operations are conceivable, the present invention is not limited to the circuit shown in FIG. 7, and FIG. 7 is shown as a preferable example.

The phase difference detection unit 16 is a phase comparator, and various types thereof are known. The phase difference detection unit 16 in FIG. 7 includes a plurality of flip-flops FFs that are connected in series, another flip-flop FF at the fourth stage to which the output of the third stage flip-flop FF is input and which is provided in parallel with respect to the fourth stage flip-flop that is connected in series, a NOT circuit connected to the last stage flip-flop FF, and a NAND circuit that is connected to both an output terminal of another flip-flop FF at the fourth stage provided at the parallel position and an output terminal of the NOT circuit. An output signal SJ is output from the NAND circuit.

The first clock CLK1 is input to the first stage flip-flop FF of the phase difference detection unit 16 and the second clock CLK2 is input to the clock input terminal. The second clock CLK2 is input to the clock input terminals of the first to fourth flip-flops FFs of a series system. The third clock CLK3 is input to the clock input terminal of another flip-flop FF at the fourth stage provided at the parallel position and the last stage flip-flop FF.

The reset instruction unit 17 includes a multiplexer (indicated by a trapezoid) to which an output signal SJ of the phase difference detection unit 16 at the previous stage is input, the first stage flip-flop FF to which the output of the multiplexer is input, the second stage flip-flop FF that is provided at a stage subsequent to the first stage flip-flop FF with a NOT circuit therebetween, a NAND circuit to which both the output of the second stage flip-flop FF and the output of the first stage flip-flop FF are input, and the third stage flip-flop FF to which the output of the NAND circuit is input. The reset instruction signal RSTn is output from the third stage flip-flop FF.

A multiplexer in the reset instruction unit 17 is a selector, and the first clock CLK1 or a low level signal L is selectively output according to a logic state of the input output signal SJ (selection control input). For example, when the logic level of the selection control input is LOW, the low level is selected, and when the logic level of the selection control input is HIGH, the first clock CLK1 is selected. Here, the second clock CLK2 is input to the clock input terminal of each of the flip-flops FFs in the reset instruction unit 17.

The frequency division unit 14 is a frequency divider having a reset function, and the reset instruction signal RSTn output from the reset instruction unit 17 at the previous stage is input to a 3-input NAND circuit in the frequency division unit 14.

The frequency division unit 14 includes the first stage flip-flop FF, a multiplexer (indicated by a trapezoid) to which both the output of the first stage flip-flop FF and a low level signal L are input, and additionally, the reset instruction signal RSTn is input as the selection control input, the second stage flip-flop FF to which the output of the multiplexer is input, and the third stage flip-flop FF to which the output of the second stage flip-flop FF is input. A reset terminal in the frequency divider 14 is a terminal group to which the reset instruction signal (reset signal) RSTn is input.

The multiplexer of the frequency division unit 14 is also a selector, and selectively outputs an output signal of the first stage flip-flop FF or a low level signal L according to a logic state of the input reset instruction signal RSTn (selection control input). For example, when the logic level of the selection control input is LOW, the low level is selected, and when the logic level of the selection control input is HIGH, the output signal of the first stage flip-flop FF is selected. The third clock CLK3 is output from the multiplexer. The output of the second stage and third stage flip-flops FFs is input to the NAND circuit together with the reset instruction signal RSTn. Here, the second clock CLK2 is input to the clock input terminal of each of the flip-flops FFs in the reset instruction unit 17.

Figure 8:
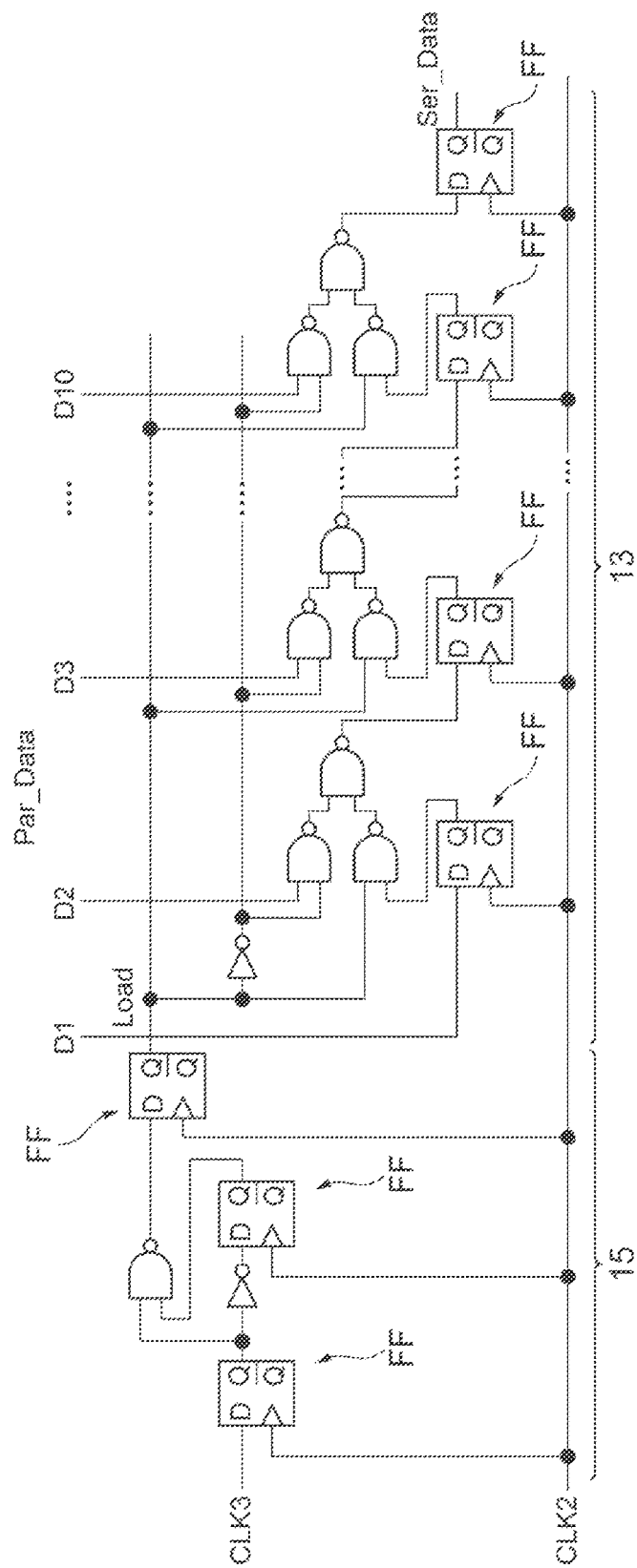
FIG. 8 is a circuit diagram showing an example of a logic circuit group (a load signal generation unit 15 and a conversion unit 13).

FIG. 8 is a circuit diagram showing an example of a logic circuit group (the load signal generation unit 15 and the conversion unit 13) for implementing the above logic operation. Since various circuit configurations for implementing the above operations are conceivable, the present invention is not limited to the circuit shown in FIG. 8, and FIG. 8 is shown as a preferable example.

The load signal generation unit 15 includes the first stage flip-flop FF, a NOT circuit and a NAND circuit which are connected to a stage subsequent to the output terminal of the first stage flip-flop FF, the second stage flip-flop FF to which the output of the NOT circuit is input, the above NAND circuit to which the output of the first stage flip-flop FF and the output of the second stage flip-flop FF are input together, and the third stage flip-flop FF to which the output of the NAND circuit is input.

The third clock CLK3 is input to an input terminal of the first stage flip-flop FF. The second clock CLK2 is input to clock input terminals of the first stage, second stage, and third stage flip-flops FFs in the load signal generation unit 15. The load signal Load is output from the third stage flip-flop FF.

The conversion unit 13 (PISO) includes a plurality of flip-flops FFs to which parallel data items D1, D2, D3 . . . D10 are input and a plurality of NAND circuits to which a load signal Load is input as shown in FIG. 8. The parallel data input to each of the flip-flops FFs is transferred in synchronization with the second clock CLK2, and is sequentially output in time series as the serial data Ser_Data from the flip-flop FF positioned on the right side in FIG. 8.

As described above, the serializer device shown in FIG. 1 includes a first flip-flop group (the first latch unit 11) that includes a plurality of flip-flops FFs arranged in parallel, a second flip-flop group (the second latch unit 12) that is arranged at a stage subsequent to the first flip-flop group and includes a plurality of flip-flops arranged in parallel, a parallel to serial converter (the conversion unit 13) that is provided at a stage subsequent to the second flip-flop group and is connected to a load signal output terminal, a load signal generator (the load signal generation unit 15) including a load signal output terminal, a frequency divider (the frequency division unit 14) including an output terminal connected to an input terminal of the load signal generator and a reset terminal, a reset signal generator (the reset instruction unit 17) connected to the reset terminal of the frequency divider, and a phase comparator (the phase difference detection unit 16) connected to an input of the reset signal generator. The output terminal of the frequency divider is connected to an input terminal of the phase comparator.

Here, a specific structure example of each of the blocks of the serializer device shown in FIG. 5 can use the structure of each of the circuit blocks shown in FIG. 6 to FIG. 8. In any structure of FIG. 1 and FIG. 3, the latch unit has a flip-flop group that includes a plurality of flip-flops arranged in parallel. In the structure shown in FIG. 1, the flip-flop group includes first and second flip-flop groups.

REFERENCE SIGNS LIST 1, 2 Serializer device
11 First latch unit
12 Second latch unit
13 Conversion unit
14 Frequency division unit
15 Load signal generation unit
16, 16A, 16B Phase difference detection unit
17 Reset instruction unit
21 Latch unit
23 Conversion unit
25 Load signal generation unit
26 Phase difference detection unit
27 Reset instruction unit
30 Shift register
31 to 39 Flip-flop
40 Shift register output latch unit
41 to 48 Flip-flop
50 Detection unit
51 Logic inversion circuit
52 AND circuit
60 Flip-flop
70 Detection unit

What is claimed is:

1. A serializer device configured to serialize parallel data input in synchronization with a first clock and output serial data in synchronization with a second clock, the serializer device comprising:
 a first latch unit configured to latch the input parallel data at a timing instructed by the first clock;
 a second latch unit configured to latch parallel data that is latched and output by the first latch unit at a timing instructed by a third clock with the same period as the first clock;
 a conversion unit configured to latch parallel data that is latched and output by the second latch unit at a timing instructed by a load signal with the same period as the first clock and output the latched data as the serial data in synchronization with the second clock;
 a frequency division unit configured to frequency-divide the second clock and generate the third clock;
 a load signal generation unit configured to generate the load signal based on the third clock;

a phase difference detection unit configured to detect a phase difference between either of the third clock and the load signal, and the first clock; and a reset instruction unit configured to reset a frequency division operation in the frequency division unit when the phase difference detected by the phase difference detection unit is not within a target range.

2. The serializer device according to claim 1,
wherein the phase difference detection unit includes
a shift register that uses one of the first clock and the third clock as input data and shifts the input data using a clock with a shorter period than the first clock;
a shift register output latch unit configured to latch data output from the shift register using the other of the first clock and the third clock or a timing instructed by the load signal; and
a detection unit configured to detect the phase difference based on data latched by the shift register output latch unit.

3. The serializer device according to claim 1,
wherein the phase difference detection unit includes
a flip-flop that uses one of the first clock and the third clock as input data and uses the other of the first clock and the third clock or a load signal as an input clock; and
a detection unit configured to detect the phase difference based on data output from the flip-flop.

4. A serializer device configured to serialize parallel data input in synchronization with a first clock and output serial data in synchronization with a second clock, the serializer device comprising:
a latch unit configured to latch the input parallel data at a timing instructed by the first clock;
a conversion unit configured to latch parallel data that is latched and output by the latch unit at a timing instructed by a load signal with the same period as the first clock and output the latched data as the serial data in synchronization with the second clock;
a load signal generation unit configured to generate the load signal based on the second clock;
a phase difference detection unit configured to detect a phase difference between the load signal and the first clock; and
a reset instruction unit configured to reset a load signal generation operation in the load signal generation unit when the phase difference detected by the phase difference detection unit is not within a target range.

5. A serializer device comprising:
a flip-flop group that includes a plurality of flip-flops arranged in parallel;
a parallel to serial converter that is provided at a stage subsequent to the flip-flop group and connected to a load signal output terminal;
a load signal generator including the load signal output terminal;
a frequency divider that includes an output terminal connected to an input terminal of the load signal generator and a reset terminal;
a reset signal generator that is connected to the reset terminal of the frequency divider; and
a phase comparator that is connected to an input of the reset signal generator,
wherein the output terminal of the frequency divider is connected to an input terminal of the phase comparator.

6. The serializer device according to claim 5,
wherein the flip-flop group includes
a first flip-flop group that includes a plurality of flip-flops arranged in parallel, and
a second flip-flop group that is arranged at a stage subsequent to the first flip-flop group and includes a plurality of flip-flops arranged in parallel.

* * * * *